(12) United States Patent
Uchiyama et al.

(10) Patent No.: US 11,282,999 B2
(45) Date of Patent: Mar. 22, 2022

(54) THERMOELECTRIC CONVERSION UNIT, THERMOELECTRIC CONVERSION MODULE, AND EXHAUST-GAS ELECTRICITY GENERATION UNIT

(71) Applicant: ATSUMITEC CO. LTD., Shizuoka (JP)

(72) Inventors: Naoki Uchiyama, Shizuoka (JP); Kazuya Kubo, Shizuoka (JP)

(73) Assignee: ATSUMITEC CO. LTD., Shizuoka (JP)

( * ) Notice: Subject to any disclaimer, the term of this patent is extended or adjusted under 35 U.S.C. 154(b) by 0 days.

(21) Appl. No.: 16/868,487

(22) Filed: May 6, 2020

(65) Prior Publication Data

US 2020/0266330 A1   Aug. 20, 2020

Related U.S. Application Data

(62) Division of application No. 16/087,590, filed as application No. PCT/JP2017/011249 on Mar. 21, 2017, now abandoned.

(30) Foreign Application Priority Data

Mar. 22, 2016 (JP) ................................. 2016-057279
Mar. 23, 2016 (JP) ................................. 2016-058571

(51) Int. Cl.
*H01L 35/32* (2006.01)
*F01N 5/02* (2006.01)
(Continued)

(52) U.S. Cl.
CPC ................ *H01L 35/32* (2013.01); *F01N 5/02* (2013.01); *F01N 5/025* (2013.01); *F02G 5/02* (2013.01);
(Continued)

(58) Field of Classification Search
CPC .......... H01L 35/30; H01L 35/32; F01N 5/025
See application file for complete search history.

(56) References Cited

U.S. PATENT DOCUMENTS 7,610,993 B2    11/2009   Sullivan
2010/0282456 A1 11/2010   Benignos et al.
2012/0079820 A1  4/2012   Neugebauer et al.

FOREIGN PATENT DOCUMENTS

JP    H10290590 A     10/1998
JP    2007221895 A    8/2007
(Continued)

OTHER PUBLICATIONS

Canadian Examination report dated Apr. 20, 2020, received for corresponding Canadian Application No. 3,015,618, 5 pages.
(Continued)

*Primary Examiner* — Golam Mowla
(74) *Attorney, Agent, or Firm* — Kinney & Lange, P.A.

(57) ABSTRACT

An exhaust-gas electricity generation unit is provided between an engine unit and a discharge unit. The exhaust-gas electricity generation unit includes a connecting pipe connecting the engine unit to the discharge unit and defining an exhaust-gas flow passage in which exhaust gas expelled from the engine unit flows, a plurality of thermoelectric conversion modules provided on an inner surface of the connecting pipe, along flow of heat, near the engine unit and near the discharge unit, and a flow-velocity increasing mechanism for causing the exhaust gas in the connecting pipe to have an increased flow velocity near the discharge unit than near the engine unit.

4 Claims, 7 Drawing Sheets

(51) Int. Cl.
    *H01L 35/30*   (2006.01)
    *H02N 11/00*   (2006.01)
    *F02G 5/02*    (2006.01)
(52) U.S. Cl.
    CPC ............. *H01L 35/30* (2013.01); *H02N 11/00*
                     (2013.01); *Y02T 10/12* (2013.01)

(56)        References Cited

FOREIGN PATENT DOCUMENTS

JP      2008078587  A    4/2008
    JP      2010219255  A    9/2010
    JP      2010275872  A    12/2010
    JP      2013115359  A    6/2013
    JP      2014105605  A    6/2014
    JP      2014225509  A    12/2014
    WO       199611372  A1   4/1996

OTHER PUBLICATIONS

English translation of International Search Report dated Apr. 25, 2017, for corresponding PCT Application No. PCT/JP2017/011249.
Extended European Search Report dated Oct. 23, 2019, received for corresponding European Application No. 17770222.2, 11 pages.
J.Y. Jang and C. Y. Tseng, Experimental and Numerical Analysis of Built-In Thermoelectric Generator Modules with an Elliptical Pin-Fin Heat Sink, 2015, 6 pages, vol. 9, No. 5, World Academy of Science, Engineering and Technology, International Journal of Mechanical Mechatronics Engineering.
Canadian Examination report dated Jun. 14, 2019, received for corresponding Canadian Application No. 3,015,618.

THERMOELECTRIC CONVERSION UNIT, THERMOELECTRIC CONVERSION MODULE, AND EXHAUST-GAS ELECTRICITY GENERATION UNIT

CROSS-REFERENCE TO RELATED APPLICATION(S)

This application is a division of U.S. application Ser. No. 16/087,590 filed on Sep. 21, 2018, which is the national phase of PCT Application No. PCT/JP2017/011249 filed on Mar. 21, 2017, which in turn claims priority to Japanese Application No. 2016-058571 filed on Mar. 23, 2016 and to Japanese Application No. 2016-057279 filed on Mar. 22, 2016, all of which are incorporated by reference herein.

BACKGROUND

Technical Field

The present disclosure relates to a thermoelectric conversion unit and a thermoelectric conversion module each comprising thermoelectric conversion elements for performing thermoelectric conversion based on the Seebeck effect, and an exhaust-gas electricity generation unit comprising them.

Description of Related Art

The thermoelectric conversion module is a module comprising thermoelectric conversion elements capable of converting thermal energy into electrical energy through the Seebeck effect. Thermoelectric conversion modules and thermoelectric conversion elements for forming them are attracting attention as environmentally-friendly energy-saving technology, because they can convert waste heat, expelled from industrial or consumer processes or moving vehicles, into available electricity by making use of this energy conversion property.

Such thermoelectric conversion modules are commonly formed by connecting thermoelectric conversion elements (p-type and n-type semiconductor elements) by electrodes. A thermoelectric conversion module of this type is disclosed in Patent Document 1, for example. In order to generate electricity using waste heat in exhaust gas produced in a vehicle or industrial equipment having an engine, thermoelectric conversion modules of this type are arranged downstream of a high-temperature heat source such as an engine. Such use of thermoelectric conversion modules and a thermoelectric conversion apparatus using thermoelectric conversion modules are disclosed in Patent Document 2, for example.

PRIOR ART DOCUMENT

Patent Document

Patent Document 1: Japanese Unexamined Patent Application Publication No. 2013-115359

Patent Document 2: Japanese Unexamined Patent Application Publication No. 2007-221895

However, exhaust gas from the engine decreases in temperature as it proceeds downstream (toward a discharge unit), resulting in shortage of heat. Thus, a thermoelectric conversion module comprising only a common structure constructed by connecting p-type and n-type semiconductor elements by electrodes cannot generate a sufficient amount of electricity. Further, when a plurality of thermoelectric conversion modules are arranged along flow of exhaust gas, a thermoelectric conversion module located upstream obstructs the flow of exhaust gas to a thermoelectric conversion module located downstream, which may prevent the downstream thermoelectric conversion module from generating a sufficient amount of electricity. If the downstream thermoelectric conversion module cannot generate a sufficient amount of electricity, the amount of electricity generated by the thermoelectric conversion apparatus as a whole cannot be increased.

SUMMARY

An object of the present disclosure is to provide a thermoelectric conversion unit, a thermoelectric conversion module and an exhaust-gas electricity generation unit which are intended to use flow of exhaust gas and which can absorb heat at high efficiency also at their downstream portion, and thus, generate an increased amount of electricity.

The thermoelectric conversion unit according to the present disclosure includes a plurality of thermoelectric conversion modules each including a plurality of thermoelectric conversion elements arranged adjacent to each other, first electrodes joined to first ends of the thermoelectric conversion elements to electrically connect the first ends of adjacent thermoelectric conversion elements, second electrodes joined to opposite, second ends of the thermoelectric conversion elements to electrically connect the second ends of adjacent thermoelectric conversion elements, and a heat absorber provided on first surfaces of the second electrodes which are opposite to second surfaces of the second electrodes joined to the thermoelectric conversion elements, wherein the thermoelectric conversion modules are arranged along a flow of heat in a manner that the heat absorbers of the thermoelectric conversion modules form a staggered array.

The thermoelectric conversion module according to the present disclosure includes a plurality of thermoelectric conversion elements arranged adjacent to each other, first electrodes joined to first ends of the thermoelectric conversion elements to electrically connect the first ends of adjacent thermoelectric conversion elements, second electrodes joined to opposite, second ends of the thermoelectric conversion elements to electrically connect the second ends of adjacent thermoelectric conversion elements, and a plurality of heat-absorbing fins provided on first surfaces of the second electrodes which are opposite to second surfaces of the second electrodes joined to the thermoelectric conversion elements, wherein the heat-absorbing fins form a staggered array.

The exhaust-gas electricity generation unit provided between an engine unit and a discharge unit according to the present disclosure includes a connecting pipe connecting the engine unit to the discharge unit and defining an exhaust-gas flow passage in which exhaust gas expelled from the engine unit flows, a plurality of thermoelectric conversion modules provided on an inner surface of the connecting pipe, along a flow of heat, near the engine unit and near the discharge unit, and a flow-velocity increasing means for causing the exhaust gas in the connecting pipe to have an increased flow velocity near the discharge unit as compared with near the engine unit, wherein the thermoelectric conversion modules have heat absorbers forming a staggered array.

The thermoelectric conversion unit, the thermoelectric conversion module and the exhaust-gas electricity generation unit according to the present disclosure are intended to use flow of exhaust gas and can absorb heat at high efficiency also at their downstream portion, and thus, generate an increased amount of electricity.

DETAILED DESCRIPTION

With reference to the accompanying drawings, how to carry out the thermoelectric conversion unit, the thermoelectric conversion module and the exhaust-gas electricity generation unit according to the present disclosure will be described in detail based on embodiments and variants. The present disclosure is not limited to the description given below; it can be carried out with any desired alteration that does not change the essentials thereof. The drawings used in explanation of embodiments and variants show the thermoelectric conversion unit, thermoelectric conversion module and exhaust-gas electricity generation unit according to the present disclosure and their components, schematically; in order to help understanding, the drawings may contain partial emphasis, enlargement, contraction, omission or the like, and thus, may not necessarily show the components on an accurate scale and in an accurate shape. Further, numerical values mentioned in connection with embodiments and variants are all given by way of example; they may be varied as necessary.

(Embodiment 1)
(Configuration of a Thermoelectric Conversion Module)

Figure 1:
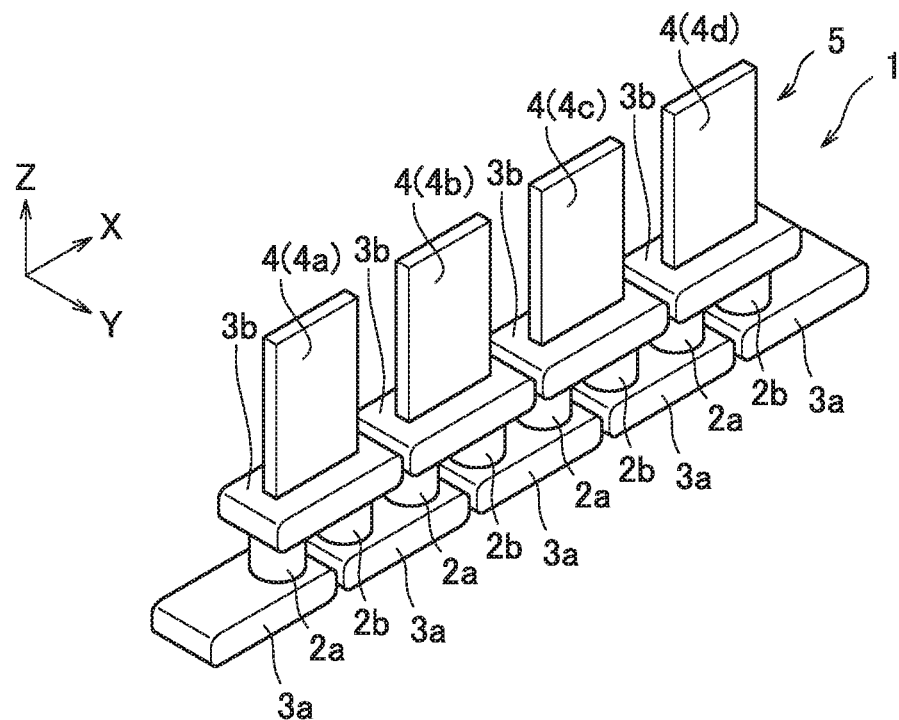
FIG. 1 is a perspective view of a thermoelectric conversion module according to embodiment 1.
Figure 2:
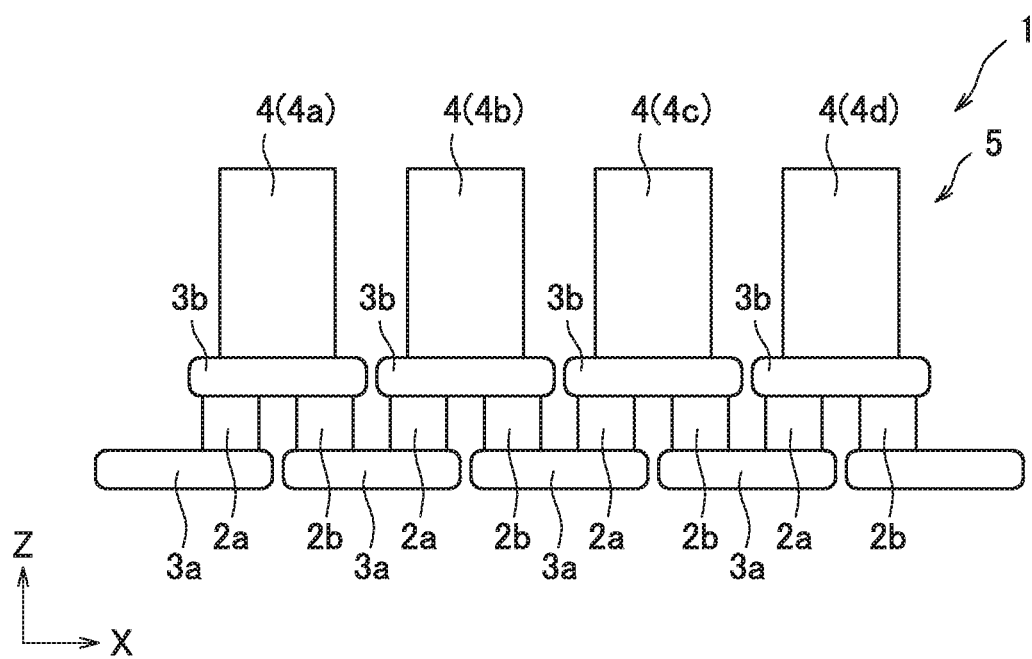
FIG. 2 is a side view of the thermoelectric conversion module according to embodiment 1.

With reference to FIGS. 1 and 2, the configuration of a thermoelectric conversion module 1 according to embodiment 1 will be described. FIG. 1 is a perspective view of the thermoelectric conversion module 1 according to embodiment 1. FIG. 2 is a side view of the thermoelectric conversion module 1 according to embodiment 1. In FIG. 1, one direction is referred to as X direction, and directions perpendicular to X direction are referred to as Y direction and Z direction. Specifically, the direction parallel to the height of the thermoelectric conversion module 1 is referred to as Z direction.

As seen from FIGS. 1 and 2, the thermoelectric conversion module 1 according to embodiment 1 has a rail-like shape. Specifically, the thermoelectric conversion module 1 according to embodiment 1 comprises first and second thermoelectric conversion elements 2a, 2b arranged adjacent to each other, and first and second electrodes 3a, 3b joined to the opposite ends of the first and second thermoelectric conversion elements 2a, 2b. The thermoelectric conversion module 1 according to embodiment 1 further comprises heat-absorbing fins 4a to 4d integrally provided on the surfaces of the second electrodes 3b (hereinafter, when not describing any particular heat-absorbing-fin, the term "heat-absorbing fin" with a reference sign "4" may be used to indicate any of these heat-absorbing-fins.

In embodiment 1, the first thermoelectric conversion elements 2a are made of an n-type semiconductor material, and the second thermoelectric conversion elements 2b are made of a p-type semiconductor material. Four first thermoelectric conversion elements 2a and four second thermoelectric conversion elements 2b (thus, eight in all) are arranged alternately in X direction, where adjacent first and second thermoelectric conversion elements 2a, 2b are electrically connected by first and second electrodes 3a, 3b. As seen from FIG. 1, the first thermoelectric conversion element 2a as well as the second thermoelectric conversion element 2b is in the shape of a cylinder and measures, for example approximately 5 mm in diameter and approximately 10 mm in height (Z-way dimension). The first and second thermoelectric conversion elements 2a, 2b are not limited to this shape. They may be in the shape of a square column, for example.

The first electrode 3a and the second electrode 3b are of the same shape (plate-like shape) and made of copper, for example. Five first electrodes 3a are arranged in a row in X direction and four second electrodes 3b are arranged in a row in X direction. As seen from FIGS. 1 and 2, the first and second thermoelectric conversion elements 2a, 2b are sandwiched between the first electrodes 3a and the second electrodes 3b in Z direction.

As a result of this arrangement of the first and second thermoelectric conversion elements 2a, 2b and the first and second electrodes 3a, 3b, the thermoelectric conversion module 1 has a rail-like shape extending straight in X direction. Further, as a result of this arrangement of the first and second thermoelectric conversion elements 2a, 2b and the first and second electrodes 3a, 3b, the first and second thermoelectric conversion elements 2a, 2b are electrically connected in series. In other words, in embodiment 1, a series circuit is formed by four first thermoelectric conversion elements 2a, four second thermoelectric conversion elements 2b, five first electrodes 3a and four second electrodes 3b arranged in X direction. The first electrodes 3a located at the opposite ends of the thermoelectric conversion module 1 function as extraction electrodes for external connection. The electricity generated by the thermoelectric conversion module 1 can thus be extracted externally.

The first electrode 3a as well as the second electrode 3b is not limited to a copper plate; they may be made of another electrically-conductive material (metal such as aluminum, for example). The number and shape of the first and second electrodes 3a, 3b are not limited to the above, but may be changed appropriately depending on the first and second thermoelectric conversion elements 2a, 2b (in other words, the magnitude of electromotive force). Further, the first and second electrodes 3a, 3b may be arranged to connect the first and second thermoelectric conversion elements 2a, 2b in parallel.

The heat-absorbing fins 4 are integrally joined to those surfaces (i.e., first surfaces) of the second electrodes 3b which are opposite to the surfaces (i.e., second surfaces) joined to the thermoelectric conversion elements. In embodiment 1, the heat-absorbing fin 4 is a plate of SUS439 which is a metal relatively high in thermal conductivity. When the thermoelectric conversion module 1 is arranged in an exhaust gas (heat) flow passage, the heat-absorbing fins 4 directly contact the exhaust gas, thereby raising the temperature of the second electrodes 3b to a greater extent, and thus, producing a greater temperature difference between the first electrodes 3a and the second electrodes 3b. The thermoelectric conversion module 1 can thus absorb heat at high efficiency and generate an increased amount of electricity. In the thermoelectric conversion module 1, although the four heat-absorbing fins 4 each contribute to temperature rise of the corresponding second electrode 3b, the four heat-absorbing fins 4 can be considered to form a single heat absorber 5 extending in X direction, and it can be said that the heat absorber 5 consisting of the four heat-absorbing fins 4 brings about a temperature rise at the high-temperature side of the thermoelectric conversion module 1.

If the heat-absorbing fins 4 can have a surface area increased by changing the width (X-way dimension), thickness (Y-way dimension) and/or height (Z-way dimension), they can raise the temperature of the second electrodes 3b more efficiently. The size of the heat-absorbing fin 4 is however determined depending on the amount of electricity to be generated by the thermoelectric conversion module 1.

(Method for Fabricating a Thermoelectric Conversion Module)

A method for fabricating a thermoelectric conversion module 1 according to embodiment 1 is as follows: First thermoelectric conversion elements 2a, second thermoelectric conversion elements 2b, first electrodes 3a, second electrodes 3b and heat-absorbing fins 4 are prepared and arranged between two punches functioning as conducting pressing members in a fabricating apparatus. Then, pressure is applied by pressing the punches to the first thermoelectric conversion elements 2a, second thermoelectric conversion elements 2b, first electrodes 3a, second electrodes 3b and heat-absorbing fins 4 arranged between them while current is applied. As a result, the first electrodes 3a and the second electrodes 3b are diffusion-bonded (plasma-bonded) to the first and second thermoelectric conversion elements 2a, 2b and the heat-absorbing fins 4 are diffusion-bonded (plasma-bonded) to the second electrodes, so that a rail-shaped thermoelectric conversion module 1 comprising the first and second electrodes 3a, 3b connected in series is formed. The application of pressure and current is performed within a vacuum chamber or a chamber with a nitrogen gas atmosphere or an inert gas atmosphere. (Configuration of a thermoelectric conversion unit)

Figure 3:
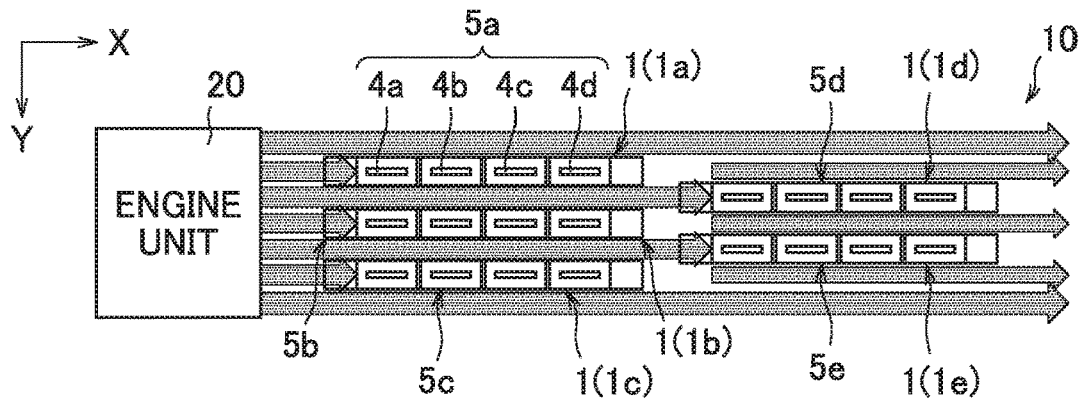
FIG. 3 is a top view schematically showing the configuration of a thermoelectric conversion unit according to embodiment 1.

With reference to FIG. 3, a thermoelectric conversion unit 10 according to embodiment 1 will be described. FIG. 3 is a top view schematically showing the configuration of the thermoelectric conversion unit 10 according to embodiment 1. As shown in FIG. 3, the thermoelectric conversion unit 1 is arranged downstream of an engine unit 20 with respect to the flow of exhaust gas. The thermoelectric conversion unit 10 thus generates electricity using heat in exhaust gas expelled from the engine unit 20.

The thermoelectric conversion unit 10 comprises five thermoelectric conversion modules 1. Specifically, five thermoelectric conversion modules 1 are arranged to extend along, or parallel to the flow of exhaust gas (heat) (indicated by arrows in FIG. 3). X direction, Y direction and Z direction are common to FIGS. 1, 2 and 3. The five thermoelectric conversion modules 5 are arranged in a staggered array. In the thermoelectric conversion unit 10, the five thermoelectric conversion modules 5 may be wired in a manner allowing electricity to be extracted from the individual thermoelectric conversion modules. Alternatively, the five thermoelectric conversion modules 5 may be connected in series to allow great electricity to be extracted. Here, the five thermoelectric conversion modules 1 are arranged, for example in a connecting pipe (not shown) provided between the engine unit 2 and a discharge unit (not shown) for discharging exhaust gas into the outdoors.

When mentioning the individual thermoelectric conversion modules 10 constituting the thermoelectric conversion unit 10, they will be referred to as thermoelectric conversion modules 1a, 1b, 1c, 1d and 1e. Likewise, when mentioning the individual heat absorbers 5 provided to the thermoelectric conversion modules, they will be referred to as heat absorbers 5a, 5b, 5c, 5d and 5e.

As shown in FIG. 3, the thermoelectric conversion modules 1 in the thermoelectric conversion unit 10 are arranged along the flow of exhaust gas in a staggered array, so that the heat absorbers 5, each consisting of heat-absorbing fins 4a to 4d arranged in X-direction in which the thermoelectric conversion module extends, form a staggered array. The staggered array allows the individual heat absorbers 5 to contact the exhaust gas from the engine unit 20 in good manner. In other words, each heat absorber 5 can contact the exhaust gas without being obstructed by the other heat absorbers 5, and thus, absorb a sufficient amount of heat. As seen from the flow of exhaust gas indicated by arrows in FIG. 3, the heat absorbers 5a, 5b, 5c cause a decrease in exhaust-gas flow rate downstream thereof. However, the exhaust gas flows through the spaces between the heat absorbers 5a, 5b, 5c to reach the heat absorbers 5b, 5c, so that also the heat absorbers 5b, 5c located downstream can absorb heat at high efficiency. Consequently, the thermoelectric conversion unit 10 can generate a sufficient amount of electricity also at its downstream portion, resulting in an increase in the amount of electricity generated by the thermoelectric conversion unit 10 as a whole.

Although in embodiment 1, the heat absorbers 5a to 5c of the upstream-side thermoelectric conversion modules 1a to 1c and the heat absorbers 5d, 5e of the downstream-side thermoelectric conversion modules 1d, 1e are provided to have the same shape and the same surface area, they may be provided such that the downstream-side heat absorbers 5d, 5e are greater in surface area than the upstream-side heat absorbers 5a to 5c, considering that the temperature of exhaust gas decreases in the direction of flow. To sum up, the size and the surface area of the heat absorber 5 and the heat-absorbing fin 4 may be appropriately determined for each thermoelectric conversion module 1, depending on temperature distribution within the connecting pipe, to enable the thermoelectric conversion unit 10 to generate a sufficient amount of electricity also at its downstream portion, thereby increasing the amount of electricity generated by the thermoelectric conversion unit 10 as a whole.

The thermoelectric conversion module 1 is not limited to a rail-like shape. It may be a different shape such as a shape extending wider on X-Y plane. Also in such case, it is important for the thermoelectric conversion unit 10 to ensure that the heat absorber 5 of each thermoelectric conversion module 1 does not hinder the heat absorbers 5 of the other thermoelectric conversion modules 1 from absorbing heat, for example by arranging the heat absorbers 5 in a staggered array.

(Variants)
(Configuration of Variant Thermoelectric Conversion Modules)

Figure 4:
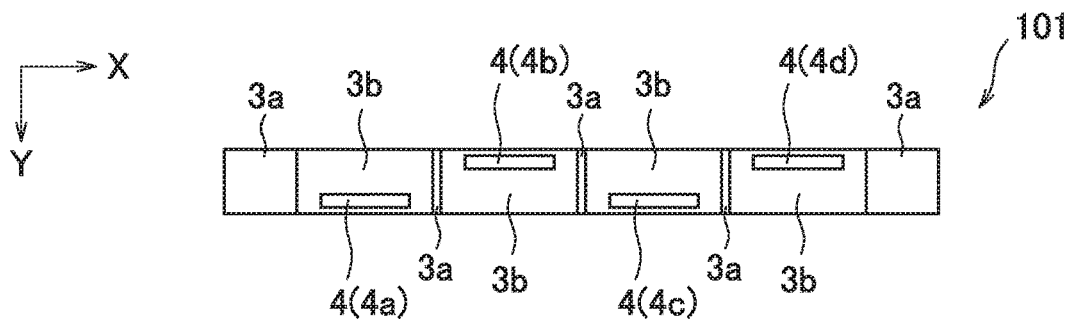
FIG. 4 is a top view of a thermoelectric conversion module according to variant 1.
Figure 5:
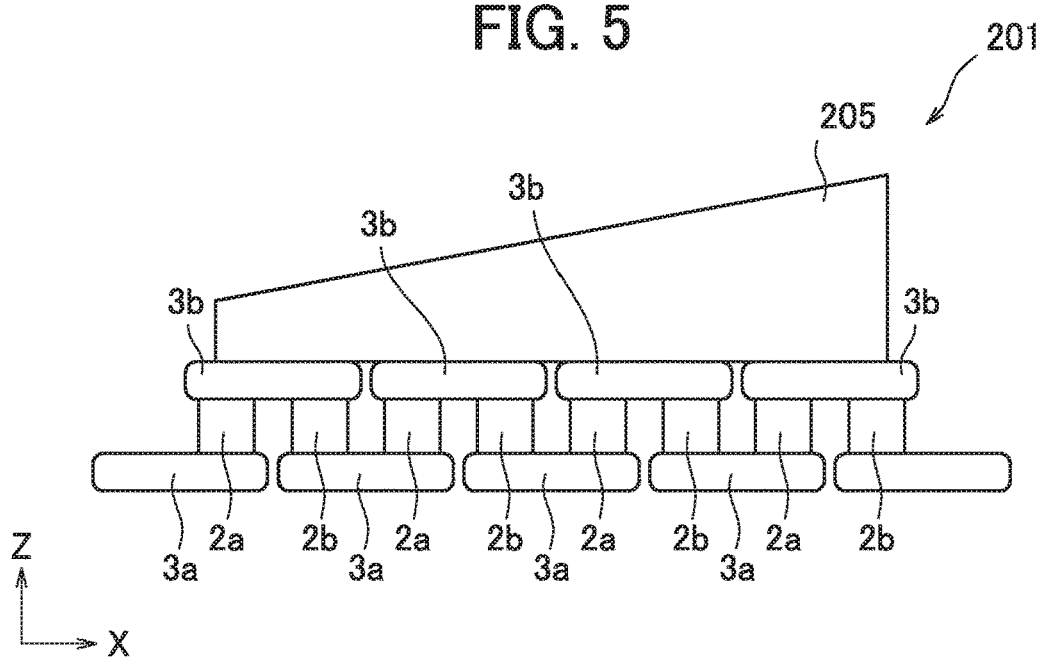
FIG. 5 is a side view of a thermoelectric conversion module according to variant 2.
Figure 6:
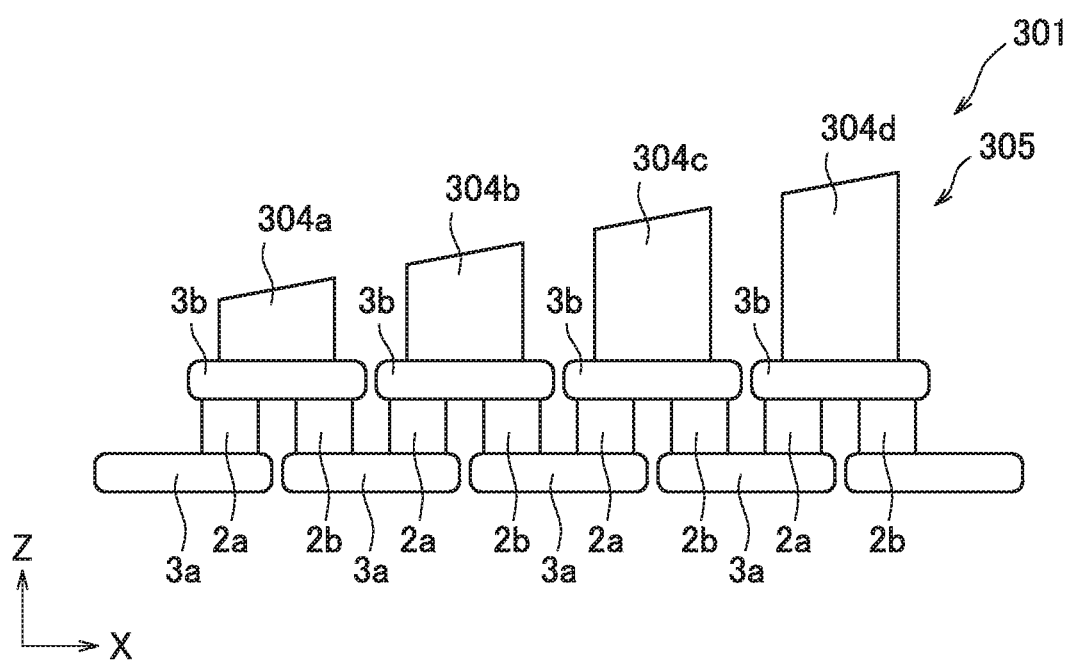
FIG. 6 is a side view of a thermoelectric conversion module according to variant 3.
Figure 7:
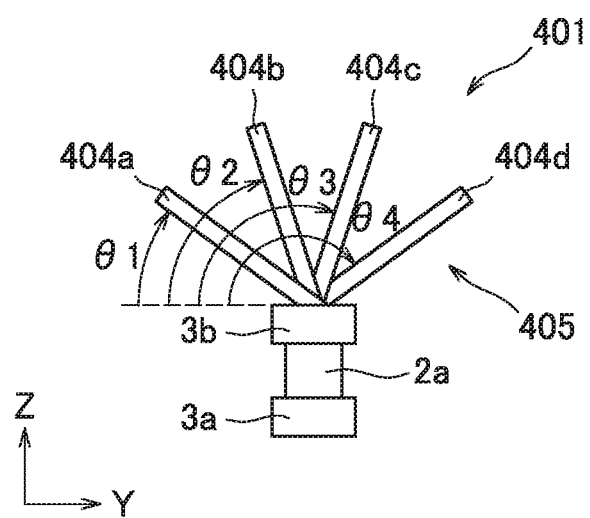
FIG. 7 is a front view of a thermoelectric conversion module according to variant 4.

Next, with reference to FIGS. 4 to 7, variants of the thermoelectric conversion module will be described in detail. FIG. 4 is a top view of a thermoelectric conversion module 101 according to variant 1, FIG. 5 is a side view of a thermoelectric conversion module 201 according to variant 2, FIG. 6 is a side view of a thermoelectric conversion module 301 according to variant 3, and FIG. 7 is a front view of a thermoelectric conversion module 401 according to variant 4. With regard to the variants, the components and elements corresponding to those in embodiment 1 are assigned the same reference signs, and the description thereof will be omitted.

As shown in FIG. 4, the thermoelectric conversion module 101 according to variant 1 has, unlike the thermoelectric conversion module 1, heat-absorbing fins 4a to 4d arranged in a staggered array. Thus, in the thermoelectric conversion module 101, each heat-absorbing fin does not hinder the other heat-absorbing fins from absorbing heat. This arrangement allows also the downstream-side (+X-side) heat-absorbing fins 4c, 4d to absorb heat at high efficiency, thereby producing a greater temperature difference between the downstream-side electrodes. Consequently, the thermoelectric conversion module 101 can generate an increased amount of electricity.

When a thermoelectric conversion unit 10 is constructed using the thermoelectric conversion modules 101 with the heat-absorbing fins 4 arranged in a staggered array, the thermoelectric conversion unit 10 may be able to generate a sufficiently-increased amount of electricity even if the thermoelectric conversion modules 101 are not arranged in a staggered array as in embodiment 1. This is because in the thermoelectric conversion unit 1 as a whole, the heat-absorbing fins 4 form a staggered array, which reduces the risk of the upstream-side (−X-side) thermoelectric conversion modules 101 hindering the downstream-side thermoelectric conversion modules from absorbing heat.

Next, as shown in FIG. 5, the thermoelectric conversion module 201 according to variant 2 has, unlike the thermoelectric conversion module 1, a heat absorber 205 consisting of a single heat-absorbing fin shared by the second electrodes. The heat-absorbing fin is trapezoidal on X-Z plane, and has a surface area increasing from the upstream side (−X side) to the downstream side (+X-side). In other words, the thermoelectric conversion module 201 has a heat absorber 205 with a height increasing in the direction of the flow of exhaust gas. The heat absorber 205 provided this way can absorb heat at high efficiency also at its downstream portion, thereby producing a greater temperature difference between the downstream-side electrodes. The heat absorber 205 provided this way can therefore increase the amount of electricity generated by the thermoelectric conversion module 201.

Since the thermoelectric conversion module 201 comprises the first and second thermoelectric conversion elements 2a, 2b connected in series, it is required that the heat absorber 205 be made of an electrical insulating material. The materials usable for the heat absorber 205 include aluminum nitride and aluminum oxide.

Next, as shown in FIG. 6, the thermoelectric conversion module 301 according to variant 3 has, unlike the thermoelectric conversion module 1, a heat absorber 305 consisting of four heat-absorbing fins 304a, 304b, 304c, 304d different in surface area. More specifically, the edge of each heat-absorbing fin 304 opposite to the edge joined to the second electrode 3b is inclined, so that each heat-absorbing fin has a height (Z-way dimension) gradually increasing toward the downstream side (+X-side). Further, the four heat-absorbing fins 304 are provided such that a heat-absorbing fin nearer to the downstream end of the module is greater in size and surface area. Thus, it can be said that the heat absorber 305 of the thermoelectric conversion module 301 has a height increasing in the direction of the flow of exhaust gas.

The heat absorber 305 provided this way can absorb heat at high efficiency also at its downstream portion, thereby producing a greater temperature difference between the downstream-side electrodes. The heat absorber 305 provided this way can therefore increase the amount of electricity generated by the thermoelectric conversion module 201.

Next, as shown in FIG. 7, the thermoelectric conversion module 401 according to variant 4 has, unlike the thermoelectric conversion module 1, heat-absorbing fins 403 tilted at different angles to the second electrode 3b. More specifically, the four heat-absorbing fins 404a to 404b are arranged along the flow of exhaust gas and tilted such that a heat-absorbing fin nearer to the downstream end of the module is tilted at a greater angle to the second electrode 3b, thus the heat-absorbing fin 403a nearest to the upstream (−X-side) end being tilted at the smallest angle to the second electrode 3b and the heat-absorbing fin 403d nearest to the downstream (+X-side) end being tiled at the greatest angle to the second electrode 3b. For example, the tilt angles may be determined such that the tilt angle $\theta1$ of the heat-absorbing fin 403a to the second electrode 3b is approximately 30°, the tilt angle $\theta2$ of the heat-absorbing fin 403b to the second electrode 3b is approximately 70°, the tilt angle $\theta3$ of the heat-absorbing fin 403c to the second electrode 3b is approximately 110°, and the tilt angle $\theta4$ of the heat absorbing fin 403d to the second electrode 3b is approximately 150°.

When the heat absorber 405 consists of the heat-absorbing fins 404a to 404d tilted at different angles to the second electrode 3b, each heat-absorbing fin 404 does not hinder the other heat-absorbing fins 404 from absorbing heat, as is the case with the heat-absorbing fins arranged in a staggered array. This arrangement allows also the downstream-side (+X-side) heat-absorbing fins 404 to absorb heat at high efficiency, thereby producing a greater temperature difference between the downstream-side electrodes. Consequently, the thermoelectric conversion module 401 can generate an increased amount of electricity.

When a thermoelectric conversion unit 10 is constructed using the thermoelectric conversion modules 401 with the heat-absorbing fins 4 tilted at different angles, the thermoelectric conversion unit 10 may be able to generate a sufficiently-increased amount of electricity even if the thermoelectric conversion modules 401 are not arranged in a staggered array as in embodiment 1. This is because in the thermoelectric conversion unit 10 as a whole, the risk of the heat-absorbing fins 404 of upstream-side (−X-side) thermoelectric conversion modules 401 hindering the heat-absorbing fins 404 of downstream-side (+X-side) thermoelectric conversion modules from contacting exhaust gas (or in other words, absorbing heat) is reduced.

(Configuration of a Variant Thermoelectric Conversion Unit)

Figure 8:
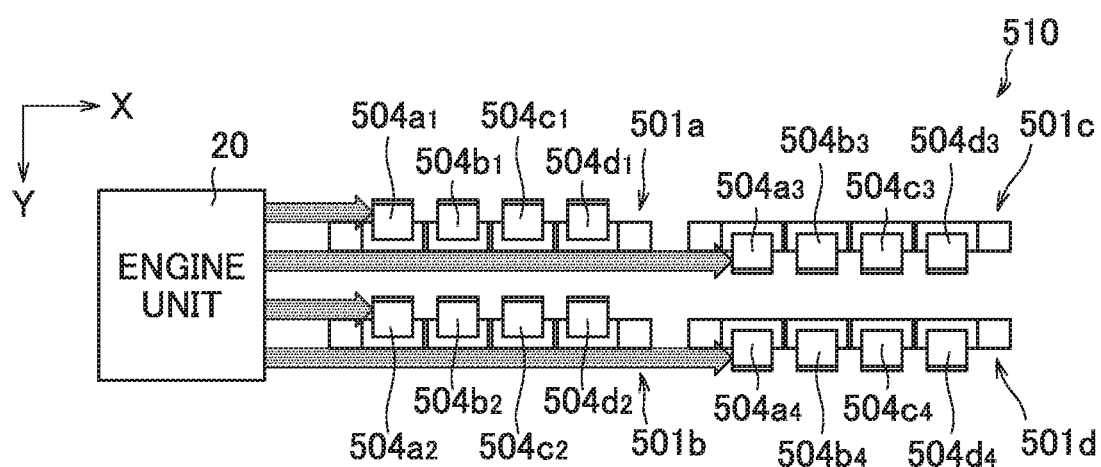
FIG. 8 is a top view of a thermoelectric conversion unit according to variant 5.
Figure 9:
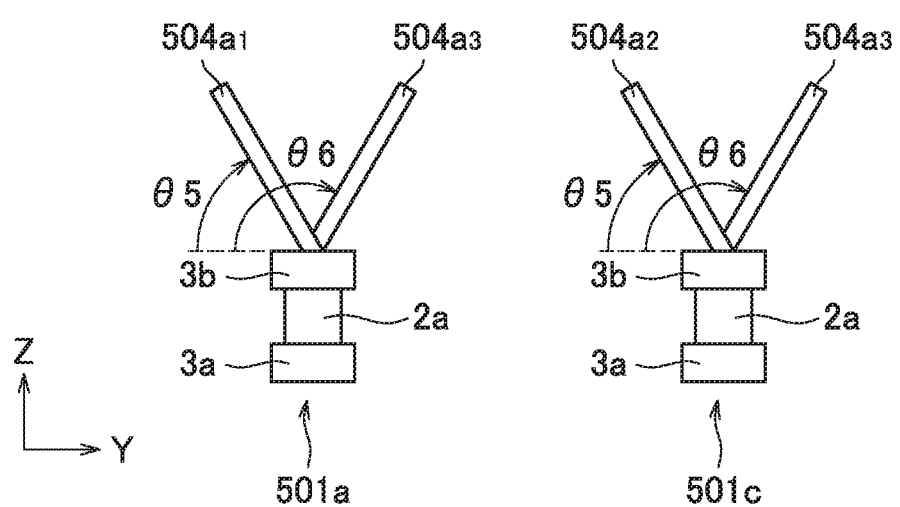
FIG. 9 is a front view of the thermoelectric conversion unit according to variant 5.

Next, with reference to FIGS. 8 and 9, a variant of the thermoelectric conversion unit will be described in detail. FIG. 8 is a top view of a thermoelectric conversion unit 501 according to variant 5, and FIG. 9 is a front view of the thermoelectric conversion unit 501 according to variant 5. With regard to variant 5, the components and elements corresponding to those in embodiment 1 are assigned the same reference signs, and the description thereof will be omitted.

As shown in FIG. 8, the thermoelectric conversion unit 510 according to variant 5 comprises four thermoelectric conversion modules 501a to 501d arranged in a matrix along the flow of exhaust gas. As seen from FIGS. 8 and 9, the heat-absorbing fins of upstream-side (−X-side) thermoelectric conversion modules 501a, 501b are different in tilt angle to the second electrode 3b than the heat-absorbing fins of downstream-side (+X-side) thermoelectric conversion modules 501c, 501d. Specifically, in the thermoelectric conversion module 501a, the tilt angle $\theta 5$ of the heat-absorbing fins $504a_1$, $504b_1$, $504c_1$, $504d_1$ to the second electrode 3b is approximately 45°. Also in the thermoelectric conversion module 501b, the tilt angle $\theta 5$ of the heat-absorbing fins $504a_2$, $504b_2$, $504c_2$, $504d_2$ to the second electrode 3b is approximately 45°. In the thermoelectric conversion module 501c, by contrast, the tilt angle $\theta 6$ of the heat-absorbing fins $504a_3$, $504b_3$, $504c_3$, $504d_3$ to the second electrode 3b is approximately 135°, and also in the thermoelectric conversion module 501d, the tilt angle $\theta 6$ of the heat-absorbing fins $504a_4$, $504b_4$, $504c_4$, $504d_4$ to the second electrode 3b is approximately 135°. Hereinafter, when not describing any particular heat-absorbing fin, the term "heat-absorbing fin" with a reference sign "504" may be used).

In variant 5, the heat-absorbing fins (or in other words, heat absorbers) in the upstream-side modules and those in the downstream-side modules are different in tilt angle, which allows the heat-absorbing fins 504 in the thermoelectric conversion modules 501a to 501d to contact the exhaust gas from the engine unit 20 in good manner. In other words, the heat absorber of each of the thermoelectric conversion modules 501a to 501d is not hindered from contacting the exhaust gas by the heat absorbers of the other thermoelectric conversion modules, and thus, able to absorb a sufficient amount of heat. As seen from the flow of exhaust gas indicated by arrows in FIG. 8, for example, the heat-absorbing fins $504a_1$ to $504d_1$ of the thermoelectric conversion module 501a causes a decrease in exhaust-gas flow rate downstream of the thermoelectric conversion module 501a. However, the exhaust gas flows through the space between the thermoelectric conversion modules 501a and 501b to reach the heat-absorbing fins $504a_3$ to $504d_3$ of the thermoelectric conversion module 501c, so that also the downstream-side heat-absorbing fins $504a_3$ to $504d_3$ can absorb heat at high efficiency. Consequently, the thermoelectric conversion unit 510 can generate a sufficient amount of electricity also at its downstream portion, resulting in an increase in the amount of electricity generated by the thermoelectric conversion unit 10 as a whole.

Although in variant 5, the heat-absorbing fins 504 in each of the thermoelectric conversion modules 501a to 501d are identical in shape, size and surface area, they may be provided such that a heat-absorbing fin nearer to the downstream end of the module is greater in surface area, as in variant 3. Further, the heat-absorbing fins in each thermoelectric conversion module may be replaced by a single heat-absorbing fin of variant 2. Furthermore, variant 5 may be combined with variant 1 such that the heat-absorbing fins in each of the thermoelectric conversion modules 501a to 501d are arranged in a staggered array. Needless to say, in variant 5, the thermoelectric conversion modules 501a to 501d may be arranged in a staggered array as in embodiment 1. To sum up, features of the embodiment and its variants may be modified and/or combined appropriately, depending on the shape of the exhaust-gas flow passage and the temperature distribution therein.

(Embodiment 2)

Figure 10:
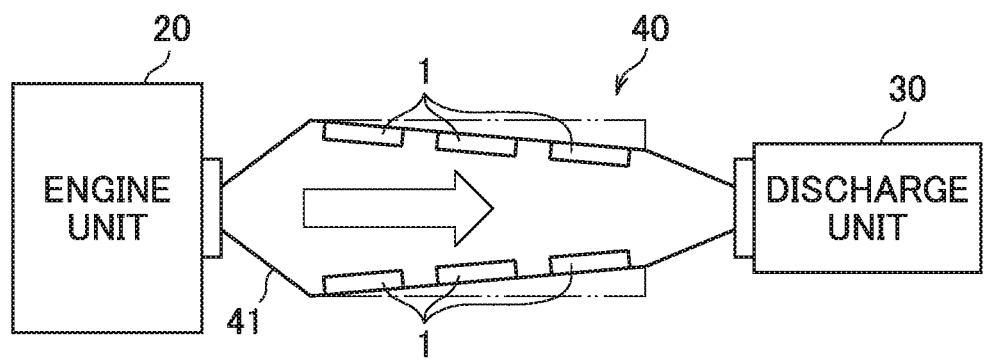
FIG. 10 is a top view schematically showing an exhaust-gas electricity generation unit according to embodiment 2 with other units.
Figure 11:
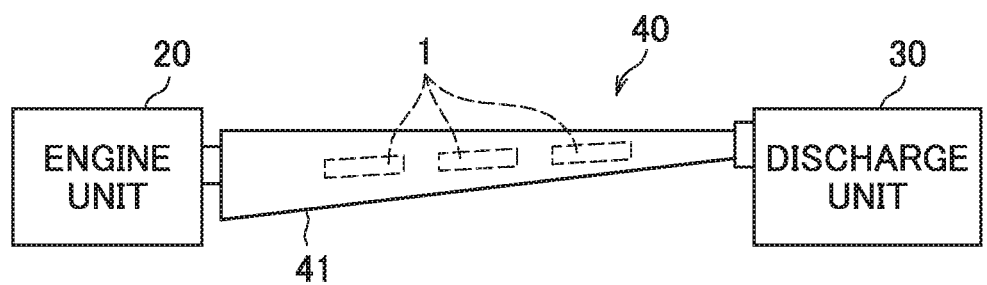
FIG. 11 is a side view schematically showing the exhaust-gas electricity generation unit according to embodiment 2 with the other units.

Next, with reference to FIGS. 10 and 11, the configuration of an exhaust-gas electricity generation unit 40 according to embodiment 2 comprising the above-described thermoelectric conversion modules 1 will be described. FIG. 10 is a top view schematically showing the exhaust-gas electricity generation unit 40 according to embodiment 2 with other units, where the internal structure of the exhaust-gas electricity generation unit 40 is visualized. FIG. 11 is a side view schematically showing the exhaust-gas electricity generation unit 40 according to embodiment 2 with the other units.

As seen from FIGS. 10 and 11, the exhaust-gas electricity generation unit 40 according to embodiment 2 is arranged between an engine unit 20, provided in a passenger vehicle or industrial equipment requiring an engine, and a discharge unit 30. The exhaust-gas electricity generation unit 40 comprises a connecting pipe 41 which connects the engine unit 20 to the discharge unit 30 and defines an exhaust-gas flow passage in which exhaust gas expelled from the engine unit 20 flows. The exhaust-gas electricity generation unit 40 further comprises six thermoelectric conversion modules 1 arranged on inner side surfaces of the connecting pipe 41. The number of the thermoelectric conversion modules 1 is not limited to six but may be changed appropriately depending on the size of the exhaust-gas electricity generation unit 40, the amount of electricity to be generated and the size of the thermoelectric conversion module 1.

As seen from FIG. 10, the exhaust-gas flow passage defined by the connecting pipe 41 has a width which gradually increases from the engine unit 20 side up to a desired measurement, and then gradually decreases toward the discharge unit 30 side. In other words, the exhaust-gas flow passage defined by the connecting pipe 41 is once expanded widthways in a region near the engine unit 20 and then gradually constricted toward the discharge unit 30 side. Further, as seen from FIG. 11, the exhaust-gas flow passage defined by the connecting pipe 41 has a height gradually decreasing from the engine unit 20 side toward the discharge unit 30 side. In other words, the exhaust-gas flow passage defined by the connecting pipe 41 is gradually constricted also height-ways from the engine unit 2 side toward the discharge unit 30 side. Consequently, the flow passage area of the connecting pipe 41 generally decreases from the engine unit 20 side toward the discharge unit 30 side, although once increasing near the engine unit 20.

Because of this shape of the connecting pipe 41, high-temperature exhaust gas expelled from the engine unit 20 is once expanded in the connecting pipe 41 but gradually converged toward the discharge unit 30. Consequently, the flow velocity of the exhaust gas gradually increases toward the discharge unit 30. In other words, in the connecting pipe 41, the exhaust gas has an increased flow velocity near the discharge unit 30, as compared with near the engine unit 20.

The connecting pipe 41 of the shape described above thus functions as a flow-velocity increasing means for increasing the flow velocity of the exhaust gas. Because of this shape of the connecting pipe 41, the exhaust gas has also an increased flux density on the discharge unit 30 side.

The connecting pipe 41 is made of a heat-resisting material with a relatively low thermal conductivity to keep down a decrease in exhaust gas temperature, thereby enabling the thermoelectric conversion modules 1 to generate electricity efficiently.

In the exhaust-gas electricity generation unit 40 according to embodiment 2, because of the shape of the connecting pipe 41, the exhaust gas has an increased flow velocity on the downstream side of the exhaust-gas flow passage as compared with the upstream side thereof, which means that heat flux on the downstream side of the exhaust-gas flow passage is increased as compared with when the connecting pipe 41 is not constricted toward the downstream end. Since thermal energy is converged this way, also the downstream-side thermoelectric conversion modules 1 can be supplied with a sufficient amount of heat even though the exhaust gas has a decreased temperature on the downstream side. This results in an increase in heat absorption efficiency.

Although in embodiment 2, the connecting pipe 41 defines a flow passage trapezoidal in cross section, the connecting pipe 41 may be a cylindrical pipe defining a flow passage circular in cross section. Also in this case, it is required that the connecting pipe be constricted on the discharge unit 30 side as compared with the engine unit 20 side (so that the flow passage area is smaller on the downstream side). The locations of the thermoelectric conversion modules 1 are not limited to the inner side surfaces of the connecting pipe 41. The thermoelectric conversion modules may be arranged, for example on the inner top surface and/or the inner bottom surface of the connecting pipe 41. To sum up, they may be arranged at appropriately-selected locations on the inner surface of the connecting pipe 41.

Although in embodiment 2, the thermoelectric conversion modules 1 according to embodiment 1 are arranged on the inner side surfaces of the connecting pipe 41, thermoelectric conversion modules according to any of the above-described variants may be arranged in place of the thermoelectric conversion modules 1. Further, in place of the thermoelectric conversion modules 1, thermoelectric conversion units according to any of the above-described embodiment and variants may be arranged. In such case, the thermoelectric conversion modules or the thermoelectric conversion units can generate an increased amount of electricity, leading to an increase in electricity generated by the discharge unit 30 [sic].

(Embodiment 3)

Figure 12:
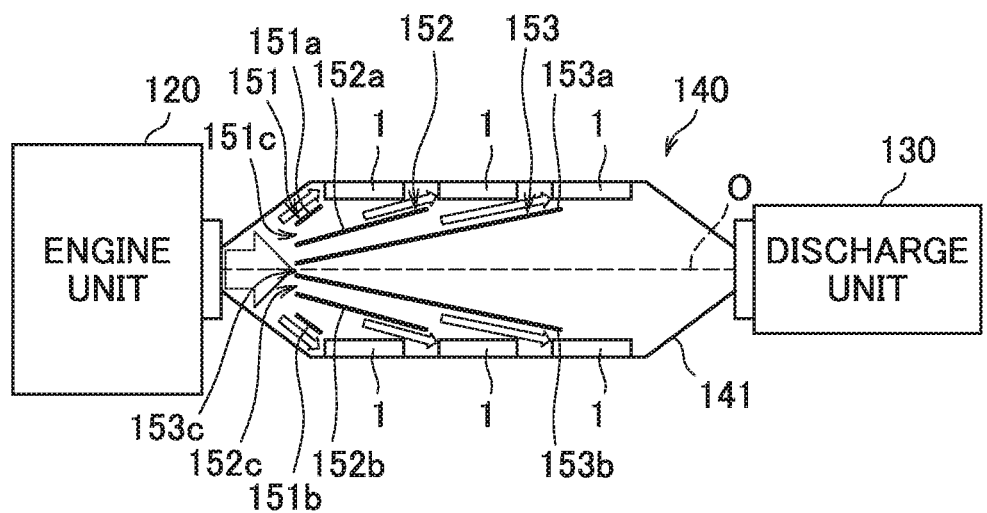
FIG. 12 is a top view schematically showing an exhaust-gas electricity generation unit according to embodiment 3 with other units.
Figure 13:
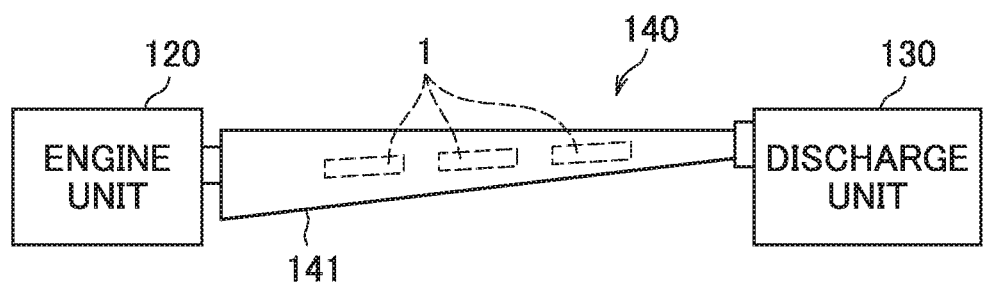
FIG. 13 is a side view schematically showing the exhaust-gas electricity generation unit according to embodiment 3 with the other units.

Although in embodiment 2, the connecting pipe 41 with a specified shape functions as a flow-velocity increasing means, a gas-flow guide (may be referred to also as "gas-flow guide element" or "flow guide") for guiding exhaust gas may be provided to function as a flow-velocity increasing means. With reference to FIGS. 12 and 13, an exhaust-gas electricity generation unit 140 according to embodiment 3 having such gas-flow guides will be described below. FIG. 12 is a top view schematically showing the exhaust-gas electricity generation unit 140 according to embodiment 3 with other units, where the internal structure of the exhaust-gas electricity generation unit 140 is visualized. FIG. 13 is a side view schematically showing the exhaust-gas electricity generation unit 140 according to embodiment 3 with the other units.

As seen from FIGS. 12 and 13, also the exhaust-gas electricity generation unit 140 according to embodiment 3 is arranged between an engine unit 120, provided in a passenger vehicle or industrial equipment requiring an engine, and a discharge unit 130. The exhaust-gas electricity generation unit 140 comprises a connecting pipe 141 which connects the engine unit 120 to the discharge unit 130 and defines an exhaust-gas flow passage in which exhaust gas expelled from the engine unit 120 flows. The exhaust-gas electricity generation unit 140 further comprises six thermoelectric conversion modules 1 arranged on inner side surfaces of the connecting pipe 141.

As seen from FIG. 12, the exhaust-gas flow passage defined by the connecting pipe 141 has a width which gradually increases from the engine unit 120 side up to a desired measurement, then keeps that measurement, and then from near the discharge unit 130, gradually decreases toward the discharge unit 130. In other words, the connecting pipe 141 has a width which is generally kept constant, although once increased in a region near the engine unit 120 and gradually decreased in a region near the discharge unit 130. Further, as seen from FIG. 13, the exhaust-gas flow passage defined by the connecting pipe 141 has a height gradually decreasing from the engine unit 120 side toward the discharge unit 130 side. In other words, the exhaust-gas flow passage defined by the connecting pipe 141 is gradually constricted height-ways from the engine unit 120 side toward the discharge unit 130 side. The connecting pipe 141 is made of a heat-resisting material with a relatively low thermal conductivity, as is the case with the connecting pipe 41 in embodiment 2.

The thermoelectric conversion modules 1 are those according to embodiment 1.

As in embodiment 2, thermoelectric conversion modules or units according to embodiment 1 or any of the variants may be arranged in place of the thermoelectric conversion modules 1. In such case, the thermoelectric conversion modules or units can generate an increased amount of electricity, leading to an increase in electricity generated by the discharge unit 130 [sic]. In the present embodiment, the thermoelectric conversion modules 1 are arranged in a row on each inner side surface of the connecting pipe 41.

As shown in FIG. 12, three gas-flow guides 151, 152, 153 are provided within the connecting pipe 141. Specifically, each gas-flow guide is provided to extend from the upstream side of the exhaust-gas flow passage (i.e., connecting pipe 141) toward the corresponding pair of thermoelectric conversion module 1.

The gas-flow guide 151 is arranged upstream of the upstream pair of thermoelectric conversion modules 1 to extend near the opposite inner side surfaces of the connecting pipe 141. The gas-flow guide 151 consists of two plate members 151a, 151b each linearly extending from near the corresponding inner side surface of the connecting pipe 141 toward the corresponding one of the upstream pair of thermoelectric conversion modules 1 (located to the left in FIG. 12). The plate members 151a, 151b constituting the gas-flow guide 151 thus extend in a manner such that they are increasingly distanced from a center line O, and thus, increasingly distanced from each other. With regard to the gas-flow guide 151 consisting of the plate members arranged this way, it can be said that the gas-flow guide has an opening 151c in a region where it traverses the connecting pipe 141.

The gas-flow guide 152 is arranged to the inner side of the gas-flow guide 151 to be partly surrounded by the gas-flow guide 151. The gas-flow guide 152 consists of two plate members 152a, 152b each linearly extending from near the center line O of the connecting pipe 141 (indicated by a broken line in FIG. 3[sic]) toward the corresponding one of the intermediate pair of thermoelectric conversion modules 1 (located in the center in FIG. 12) The plate members 152a, 152b constituting the gas-flow guide 152 thus extend in a manner such that they are increasingly distanced from the center line O, and thus, increasingly distanced from each other. With regard to the gas-flow guide 152 consisting of the plate members arranged this way, it can be said that the gas-flow guide has an opening 152c in a region where it traverses the connecting pipe 141. The gas-flow guide 152 extends longer than the gas-flow guide 151.

The gas-flow guide 153 is arranged to the inner side of the gas-flow guide 152 which is arranged to the inner side of the gas-flow guide 151, so that it is partly surrounded by the gas-flow guides 151, 152. The gas-flow guide 153 consists of two plate members 153a, 153b each linearly extending from near the center line O of the connecting pipe 141 toward the corresponding one of the downstream pair of thermoelectric conversion modules 1 (located to the right in FIG. 12). The plate members 153a, 153b constituting the gas-flow guide 153 thus extend in a manner such that they are increasingly distanced from the center line O, and thus, increasingly distanced from each other, as is the case with the gas-flow guide 152. With regard to the gas-flow guide 153 consisting of the plate members arranged this way, it can be said that the gas-flow guide has an opening 153c in a region where it traverses the connecting pipe 141. The gas-flow guide 153 extend longer than the gas-flow guides 151, 152.

As described above, the gas-flow guides 151, 152, 153 are each provided to extend from the upstream side of the exhaust-gas flow passage toward the corresponding pair of thermoelectric conversion modules 1. Because of this geometry of the gas-flow guides 151, 152, 153, part of the exhaust gas coming from the engine unit (indicated by a thick arrow in FIG. 12) is guided toward the upstream pair of thermoelectric conversion modules 1 through passageways defined between the connecting pipe 41 and the gas-flow guide 151, part of the exhaust gas is guided toward the upstream and intermediate pairs of thermoelectric conversion modules 1 through passageways defined between the gas-flow guide 151 and the gas-flow guide 152, and part of the exhaust gas is guided toward the intermediate and downstream pairs of thermoelectric conversion modules 1 through passageways defined between the gas-flow guide 152 and the gas-flow guide 153. The exhaust gas expelled from the engine unit 120 is thus guided along the gas-flow guides 151, 152, 153 toward the opposite sides of the connecting pipe 141, thus flowing toward the thermoelectric conversion modules 1 provided on the inner side surfaces of the connecting pipe 141, thereby allowing the thermoelectric conversion modules 1 to absorb heat at high efficiency.

Because of the geometry of the gas-flow guides 151, 152, 153, high-temperature exhaust gas expelled from the engine unit 120 is once expanded in an upstream region of the connecting pipe 41 and then converged and directed toward the opposite sides of the connecting pipe 141 by the gas-flow guides 151, 152, 153. Consequently, the flow velocity of the exhaust gas increases toward the discharge unit 130. In other words, in the connecting pipe 141, the exhaust gas has an increased flow velocity near the discharge unit 130, as compared with near the engine unit 120. The gas-flow guides 151, 152, 153 thus function as a flow-velocity increasing means for increasing the flow velocity of the exhaust gas. Because of the gas-flow guides 151, 152, 153, the exhaust gas has also an increased flux density on the discharge unit 130 side.

In the exhaust-gas electricity generation unit 140 according to embodiment 3, because of the gas-flow guides 151, 152, 153, the exhaust gas has an increased flow velocity on the downstream side of the exhaust-gas flow passage as compared with the upstream side thereof, which means that heat flux on the downstream side of the exhaust-gas flow passage is increased as compared with when the gas-flow guides 151, 152, 153 are not present. Since thermal energy is converged this way, also the downstream-side thermoelectric conversion modules 1 can be supplied with a sufficient amount of heat even though the exhaust gas has a decreased temperature on the downstream side. This results in an increase in heat absorption efficiency.

Although in embodiment 3, the gas-flow guides 151, 152, 153 each consist of two plate members, they are not limited to this type. For example, each gas-flow guide may consist of a single plate member curved and bended, in which an opening may be formed as necessary. Each gas-flow guide may consist of more than two plate members. In embodiment 3, the gas-flow guides 151, 152, 153 are provided to guide exhaust gas toward the opposite sides of the connecting pipe 141. If, however, thermoelectric conversion modules 1 are provided also on the top and bottom surfaces of the connecting pipe 141, structures for guiding the exhaust gas toward the top and bottom surfaces of the connecting pipe 141 may be provided. In this case, the connecting pipe 141 may be a non-cylindrical pipe such as a square or rectangular pipe. The connecting pipe 141 may be constricted toward an end (downstream end of the exhaust-gas flow passage) as in embodiment 2. The plate members constituting each gas-flow guide do not necessarily need to be straight but may be curved. The gas-flow guide 153 does not necessarily need to have an opening. In that case, all the exhaust gas expelled from the engine unit 120 is guided toward the opposite sides of the connecting pipe 141, leading to an increase in electricity generation efficiency.

(Embodiment 4)

Figure 14:
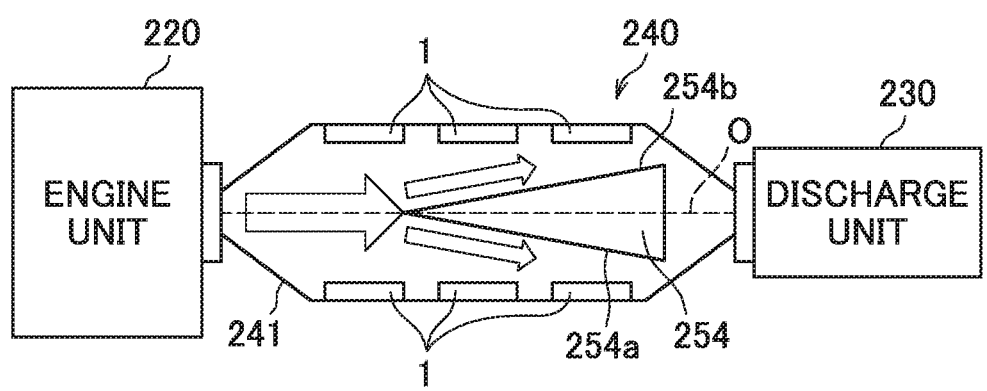
FIG. 14 is a top view schematically showing an exhaust-gas electricity generation unit according to embodiment 4 with other units.
Figure 15:
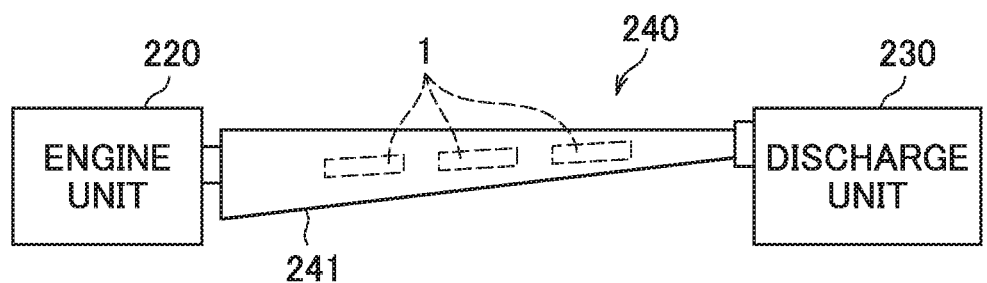
FIG. 15 is a side view schematically showing the exhaust-gas electricity generation unit according to embodiment 4 with the other units.

Although in embodiment 3, three gas-flow guides 151, 152, 153 function as a flow-velocity increasing means, a single gas-flow guide may be provided to function as a flow-velocity increasing means. With reference to FIGS. 14 and 15, an exhaust-gas electricity generation unit 240 according to embodiment 4 having a single gas-flow guide will be described below. FIG. 14 is a top view schematically showing the exhaust-gas electricity generation unit 240 according to embodiment 4 with other units, where the internal structure of the exhaust-gas electricity generation unit 240 is visualized. FIG. 15 is a side view schematically showing the exhaust-gas electricity generation unit 240 according to embodiment 4 with the other units.

As seen from FIGS. 14 and 15, also the exhaust-gas electricity generation unit 240 according to embodiment 4 is arranged between an engine unit 220, provided in a passenger vehicle or industrial equipment requiring an engine, and a discharge unit 230. Like the exhaust-gas electricity generation unit 140 according to embodiment 3, the exhaust-gas electricity generation unit 240 comprises a connecting pipe 241 and six thermoelectric conversion modules 1 arranged on inner side surfaces of the connecting pipe 241. The connecting pipe 241 is identical in shape and material to the connecting pipe 141 in embodiment 3, and the thermoelectric conversion modules 1 are identical to those in embodiment 3. The description of these will be therefore omitted.

As shown in FIG. 14, a gas-flow guide 254 is provided within the connecting pipe 241. Specifically, the gas-flow guide 254 in the shape of a triangular prism is provided to extend from the center of the exhaust-gas flow passage (i.e., connecting pipe 241) toward the downstream end thereof. The gas-flow guide has sides 254a, 254b extending from the center line O (indicated by a broken line in FIG. 5[sic]) of the connecting pipe 241 toward the opposite inner side surface of the connecting pipe 241. The gas-flow guide 254 is thus a structure which makes the flow passage area of the exhaust-gas flow passage gradually narrower from the engine unit 220 side toward the discharge unit 230 side of the connecting pipe 241. The shape of the gas-flow guide 254 is not limited to a triangular prism. The gas-flow guide may be a structure of another shape if it can make the exhaust-gas flow passage area gradually narrower toward the downstream end. The shape of the gas-flow guide may be changed appropriately depending on the cross-sectional shape of the connecting pipe 241.

Because of this shape of the gas-flow guide 254, high-temperature exhaust gas expelled from the engine unit 220 is once expanded in the connecting pipe 241 and then converged toward the discharge unit 230. Consequently, the flow velocity of the exhaust gas increases toward the discharge unit 230. In other words, in the connecting pipe 241, the exhaust gas has an increased flow velocity near the discharge unit 230, as compared with near the engine unit 220. The gas-flow guide 254 of the shape described above thus functions as a flow-velocity increasing means for increasing the flow velocity of the exhaust gas. Because of the shape of the gas-flow guide 254, the exhaust gas also has an increased flux density on the discharge unit 230 side.

In the exhaust-gas electricity generation unit 240 according to embodiment 4, because of the shape of the gas-flow guide 254, the exhaust gas has an increased flow velocity on the downstream side of the exhaust-gas flow passage as compared with the upstream side thereof, which means that heat flux on the downstream side of the exhaust-gas flow passage is increased as compared with when the gas-flow guide 254 is not present. Since thermal energy is converged this way, the downstream-side thermoelectric conversion modules 1 can be supplied with a sufficient amount of heat even though the exhaust gas has a decreased temperature on the downstream side. This results in an increase in heat absorption efficiency.

(Aspects of the Present Disclosure)

A first aspect of the present disclosure is a thermoelectric conversion unit comprising a plurality of thermoelectric conversion modules each including a plurality of thermoelectric conversion elements arranged adjacent to each other, first electrodes joined to first ends of the thermoelectric conversion elements to electrically connect the first ends of adjacent thermoelectric conversion elements, second electrodes joined to opposite, second ends of the thermoelectric conversion elements to electrically connect the second ends of adjacent thermoelectric conversion elements, and a heat absorber provided on first surfaces of the second electrodes which are opposite to second surfaces of the second electrodes joined to the thermoelectric conversion elements, wherein the thermoelectric conversion modules are arranged along a flow of heat in a manner that the heat absorbers of the thermoelectric conversion modules form a staggered array.

A second aspect of the present disclosure is a thermoelectric conversion unit according to the first aspect wherein the plurality of the thermoelectric conversion modules are provided such that the heat absorber of a thermoelectric conversion module is greater in surface area than the heat absorber of a thermoelectric conversion module located upstream thereof with respect to the flow of heat. This allows also a thermoelectric conversion module located downstream to absorb heat at high efficiency, leading to an increase in the amount of electricity generated by the thermoelectric conversion unit as a whole.

A third aspect of the present disclosure is a thermoelectric conversion unit according to the first or second aspect wherein the plurality of the thermoelectric conversion modules are provided such that the heat absorber of a thermoelectric conversion module is different in tilt angle to the second electrode than the heat absorber of a thermoelectric conversion module located upstream thereof with respect to the flow of heat. This allows a heat absorber located downstream to absorb heat without being obstructed by a heat absorber located upstream, thereby allowing also a thermoelectric conversion module located downstream to absorb heat at high efficiency, leading to an increase in the amount of electricity generated by the thermoelectric conversion unit as a whole A fourth aspect of the present disclosure is a thermoelectric conversion unit according to any of the first to third aspects wherein the heat absorber consists of a plurality of heat-absorbing fins. This helps the individual thermoelectric conversion modules to absorb heat at high efficiency.

A fifth aspect of the present disclosure is a thermoelectric conversion unit according to the fourth aspect wherein in each of the thermoelectric conversion modules, the heat-absorbing fins are arranged in a staggered array. This allows also a heat-absorbing fin located downstream to absorb heat at high efficiency, leading to an increase in the amount of electricity generated by a single thermoelectric conversion module.

A sixth aspect of the present disclosure is a thermoelectric conversion unit according to the fourth or fifth aspect wherein in each of the thermoelectric conversion modules, the plurality of heat-absorbing fins are provided such that a heat-absorbing fin and a heat-absorbing fin located downstream thereof with respect to the flow of heat are different in tilt angel to the second electrode. This allows also a heat-absorbing fin located downstream to absorb heat at high efficiency, leading to an increase in the amount of electricity generated by a single thermoelectric conversion module.

A seventh aspect of the present disclosure is a thermoelectric conversion unit according to any of the first or sixth aspect wherein the heat absorber has a height increasing in the direction of the flow of heat. This allows the heat absorber to absorb heat at high efficiency also at its downstream portion, leading to an increase in the amount of electricity generated by a single thermoelectric conversion module.

An eighth aspect of the present disclosure is a thermoelectric conversion module comprising a plurality of thermoelectric conversion elements arranged adjacent to each other, first electrodes joined to first ends of the thermoelectric conversion elements to electrically connect the first ends of adjacent thermoelectric conversion elements, second electrodes joined to opposite, second ends of the thermoelectric conversion elements to electrically connect the second ends of adjacent thermoelectric conversion elements, and a plurality of heat-absorbing fins provided on first surfaces of the second electrodes which are opposite to second surfaces of the second electrodes joined to the thermoelectric conversion elements, wherein the heat-absorbing fins are arranged in a staggered array.

A ninth aspect of the present disclosure is a thermoelectric conversion module according to the eighth aspect wherein the plurality of the heat-absorbing fins are provided such that a heat-absorbing fin and a heat-absorbing fin located downstream thereof with respect to flow of heat are different in tilt angle to the second electrode. This allows also a heat-absorbing fin located downstream to absorb heat at high efficiency, leading to an increase in the amount of electricity generated by the thermoelectric conversion module.

A tenth aspect of the present disclosure is a thermoelectric conversion module according to the eighth or ninth aspect wherein the plurality of the heat-absorbing fins are provided such that a heat-absorbing fin is greater in surface area than a heat-absorbing fin located upstream thereof with respect to flow of heat. This allows also a heat-absorbing fin located downstream to absorb heat at high efficiency, leading to an increase in the amount of electricity generated by the thermoelectric conversion module.

An eleventh aspect of the present disclosure is an exhaust-gas electricity generation unit provided between an engine unit and a discharge unit, comprising a connecting pipe connecting the engine unit to the discharge unit and defining an exhaust-gas flow passage in which exhaust gas expelled from the engine unit flows, a plurality of thermoelectric conversion modules provided on an inner surface of the connecting pipe, along a flow of heat, near the engine unit and near the discharge unit, and a flow-velocity increasing means for causing the exhaust gas in the connecting pipe to have an increased flow velocity near the discharge unit as compared with near the engine unit, wherein the thermoelectric conversion modules have heat absorbers forming a staggered array.

A twelfth aspect of the present disclosure is an exhaust-gas electricity generation unit according to the eleventh aspect wherein the connecting pipe has a flow passage area decreasing from the engine unit side toward the discharge unit side, thereby functioning as the flow-velocity increasing means. The flow-velocity increasing means of this type allows also a thermoelectric conversion module located downstream to absorb heat at high efficiency, leading to an increase in the amount of electricity generated by the thermoelectric conversion unit as a whole.

A thirteenth aspect of the present disclosure is an exhaust-gas electricity generation unit according to the eleventh aspect wherein the flow-velocity increasing means is at least one gas-flow guide for guiding the exhaust gas from near the center line of the connecting pipe toward the inner surface of the connecting pipe. The flow-velocity increasing means of this type allows also a thermoelectric conversion module located downstream to absorb heat at high efficiency, leading to an increase in the amount of electricity generated by the thermoelectric conversion unit as a whole.

A fourteenth aspect of the present disclosure is an exhaust-gas electricity generation unit according to the thirteenth aspect wherein the gas-flow guide is provided to extend from near the upstream end of the exhaust-gas flow passage toward the individual thermoelectric conversion modules and has an opening in a region where the gas-flow guide traverses the connecting pipe. The gas-flow guide of this type allows also a thermoelectric conversion module located downstream to absorb heat at high efficiency, leading to an increase in the amount of electricity generated by the thermoelectric conversion unit as a whole.

A fifteenth aspect of the present disclosure is an exhaust-gas electricity generation unit according to the thirteenth aspect wherein the gas-flow guide makes the flow passage area of the exhaust-gas flow passage gradually narrower from the engine unit side toward the discharge unit side of the connecting pipe. The gas-flow guide of this type allows also a thermoelectric conversion module located downstream to absorb heat at high efficiency, leading to an increase in the amount of electricity generated by the thermoelectric conversion unit as a whole.

EXPLANATION OF REFERENCE SIGNS

1 Thermoelectric conversion module
2a First thermoelectric conversion element
2b Second thermoelectric conversion element
3a First electrode
3b Second electrode
4 Heat-absorbing fin
5 Heat absorber
10 Thermoelectric conversion unit
20 Engine unit
30 Discharge unit
40 Exhaust-gas electricity generation unit
41 Connecting pipe
151, 152, 153 Gas-flow guide

The invention claimed is:

1. An exhaust-gas electricity generation unit provided between an engine unit and a discharge unit, comprising:
   a connecting pipe connecting the engine unit to the discharge unit and defining an exhaust-gas flow passage in which exhaust gas expelled from the engine unit flows;
   a plurality of thermoelectric conversion modules provided on an inner surface of the connecting pipe, along flow of heat, near the engine unit and near the discharge unit; and
   a flow-velocity increasing means for causing the exhaust gas in the connecting pipe to have an increased flow velocity near the discharge unit than near the engine unit;
   wherein the flow-velocity increasing means comprises at least one gas-flow guide for guiding the exhaust gas from near the center line of the connecting pipe toward the inner surface of the connecting pipe; and
   wherein each gas-flow guide of the at least one gas-flow guide is provided to extend from near an upstream end of the exhaust-gas flow passage toward respective individual ones of the thermoelectric conversion modules and has an opening in a region where the gas-flow guide traverses the connecting pipe.

2. The exhaust-gas electricity generation unit according to claim 1, wherein each gas-flow guide of the at least one gas-flow guide is provided to linearly extend from near the upstream end of the exhaust-gas flow passage toward the respective individual ones of the thermoelectric conversion modules.

3. The exhaust-gas electricity generation unit according to claim 1, wherein the connecting pipe has a flow passage area decreasing from the engine unit toward the discharge unit, thereby functioning as the flow-velocity increasing means.

4. The exhaust-gas electricity generation unit according to claim 1, wherein the at least one gas-flow guide makes the flow passage area of the exhaust-gas flow passage gradually narrower from the engine unit toward the discharge unit of the connecting pipe.

* * * * *